(12) United States Patent
Edwards

(10) Patent No.: US 6,950,310 B2
(45) Date of Patent: Sep. 27, 2005

(54) SYSTEM AND METHOD FOR SELF-LEVELING HEAT SINK FOR MULTIPLE HEIGHT DEVICES

(75) Inventor: Darvin R. Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 71 days.

(21) Appl. No.: 10/749,609

(22) Filed: Dec. 31, 2003

(65) Prior Publication Data

US 2005/0146023 A1    Jul. 7, 2005

(51) Int. Cl.⁷ ................................................ H05K 7/20
(52) U.S. Cl. ...................... 361/721; 361/676; 361/687; 361/688; 29/760; 29/834; 29/854
(58) Field of Search .................. 361/721, 676, 361/803, 810, 687–688, 696–697, 701, 704, 361/729; 29/759–760, 827, 832, 834–836, 29/842, 844, 854; 165/185, 80.3

(56) References Cited

U.S. PATENT DOCUMENTS

| | | | |
|---|---|---|---|
| 6,205,026 B1 * | 3/2001 | Wong et al. | 361/704 |
| 6,219,239 B1 * | 4/2001 | Mellberg et al. | 361/704 |
| 6,639,800 B1 * | 10/2003 | Eyman et al. | 361/704 |
| 2004/0027807 A1 * | 2/2004 | Kashiwagi | 361/704 |
| 2004/0257786 A1 * | 12/2004 | Murasawa | 361/810 |

* cited by examiner

*Primary Examiner*—Kamand Cuneo
*Assistant Examiner*—Hung S. Bui
(74) *Attorney, Agent, or Firm*—Yingsheng Tung; Wade James Brady, III; Frederick J. Telecky, Jr.

(57) ABSTRACT

A self-leveling heat sink includes a spring-arm device having at least one aperture and at least one spring-arm is coupled to a substrate. The substrate has at least one package mounted thereon, so that when the spring-arm device is mounted to the substrate the at least one package passes through the at least one aperture. A heat sink operable to remove heat from the at least one package has at least one heat sink post operable to receive a heat sink clip located at the distal end of each of the at least one spring-arms. Each of the at least one spring-arms extending from an inside edge of the at least one aperture and operable to couple the heat sink to the at least one package.

21 Claims, 5 Drawing Sheets

SYSTEM AND METHOD FOR SELF-LEVELING HEAT SINK FOR MULTIPLE HEIGHT DEVICES

TECHNICAL FIELD OF THE INVENTION

This invention relates generally to energy removal from semiconductor devices, and more particularly to a system and method for a self-leveling heat sink for semiconductor devices.

BACKGROUND OF THE INVENTION

Semiconductor devices are generally manufactured by mounting multiple packages or devices onto a printed circuit board (PCB) substrate. In order to conduct heat from the individual semiconductor devices to a heat sink, the heat sinks generally need to be in contact with the individual packages. When a PCB or ASIC has packages of differing heights, the past solution has generally been to mount a heat sink onto the substrate in such a way that it is pressed down very tightly over some of the packages in order to ensure that the heat sink is in contact with all of the packages. This method has various disadvantages. For example, if the heat sink is mounted too tightly or with too much force onto the packages of greatest height measured from the substrate, in order to contact the packages with the lowest lowest height mounted on the same substrate, the force necessary to ensure the heat sink is contact with the lowest packages may result in crushing or otherwise damaging the packages of greatest height. Additionally, if the heat sink is mounted on the substrate such that the tallest packages are contacted, the shortest packages may not be in contact with the heat sink thus reducing the heat dissipation capabilities of the system.

SUMMARY OF THE INVENTION

In accordance with embodiments of the invention, problems associated with the removal of heat from integrated circuit packages mounted on printed circuit boards (PCBs) are substantially reduced or eliminated. In one embodiment, a method includes coupling a spring-arm device to a substrate. The spring-arm device preferably has multiple apertures operable to accept packages to be passed through when the spring-arm device is mounted to the substrate. Additionally, the spring-arm device has at least one spring arm extending from an interior edge of each aperture, with a u-shaped or enclosed aperture at the distal end. The method also includes coupling at least one heat sink to the spring-arm device, so that a heat-sink post on one side of the heat sink may be inserted into the u-shaped opening or aperture at the distal end of the spring arm to retain the heat sink in position.

In another embodiment, a system is provided that includes a spring-arm device coupled to a substrate. Additionally, a heat sink having a heat-sink post located on one side is preferably inserted into a spring arm of the spring-arm device to retain the heat sink in position. The spring arms preferably extend from the interior edge of an aperture in the spring-arm device so that when the heat-sink post is inserted into the spring-arm device the heat sink is held in position over a package mounted on the substrate by spring pressure.

An advantage of the present invention includes increasing the amount of heat that can be dissipated from a PCB. Yet another advantage includes each package mounted on the substrate having a heat sink in contact therewith. Yet another advantage is the ability of the system to allow the size of each heat sink to vary according to the heat generated by the individual devices mounted on the substrate. Embodiments of the present invention may include some, none, or all of the enumerated advantages. Additional advantages will be apparent to those of ordinary skill in the art.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE INVENTION

Integrated circuit devices are contained in packages which are subsequently mounted on printed circuit boards (PCBs) for electrical functioning. During operation, these semiconductor devices generate heat that must be dissipated to allow the semiconductor device to continue functioning properly. Accordingly, current methods of heat dissipation include mounting a heat sink in contact with the pagkages disposed on a substrate. This heat sink is generally mounted to the substrate so that the individual packages of the semiconductor device contact the heat sink. Often, the individual packages on the PCB have varying heights and dimensions, thus resulting in gaps of varying sizes between the packages and the heat sink surface. Additionally, when the heat sink is tightened over the packages in an effort to ensure that the heat sink contacts each of the packages to increase the heat dissipation capabilities of the system, the packages that are tallest, or that have the largest dimensions, are often damaged or crushed in an attempt to ensure that all of the packages are in contact with the heat sink.

The amount of pressure necessary to ensure adequate energy dissipation from a semiconductor device is preferably enough to ensure constant contact between a heat sink and a semiconductor device. When the devices of a PCB have varying dimensions, and/or varying heights, the only currently-available method of ensuring constant contact includes fabricating a custom-milled heat-sink.

Figure 1:
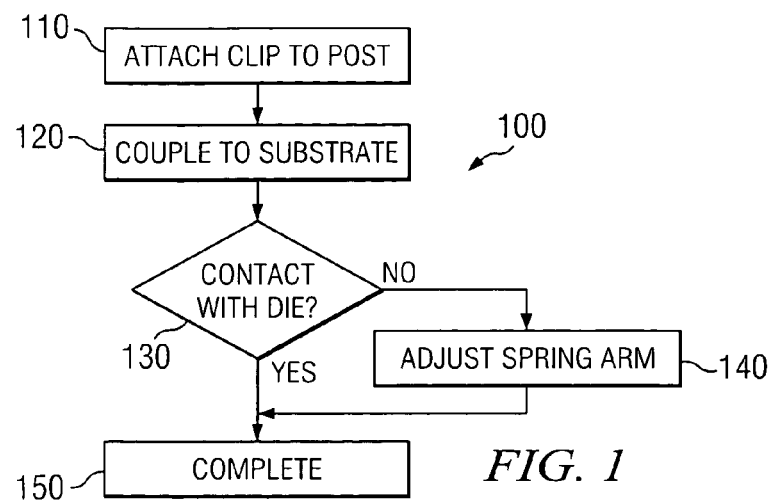
FIG. 1 is a flowchart illustrating a method according to an embodiment of the present invention.

FIG. 1 illustrates a method for manufacturing an improved heat-sink system for a semiconductor device. At step 110, a spring-arm device is coupled to a heat sink. Preferably, the spring-arm device has a number of device apertures equal to the number of packages mounted on the substrate. Alternatively, the spring-arm device may have a single aperture corresponding to a plurality of packages mounted on the substrate. Yet another embodiment may have a plurality of device apertures of similar or dissimilar dimensions, each device aperture corresponding to a plurality of devices of similar or dissimilar dimensions. Each spring-arm device is preferably manufactured out of spring steel, nylon, polyvinyl chloride (PVC) or any other material having sufficient stiffness to impart rigidity to the spring arms. Additionally, the spring-arm device may be manufactured by punching a sheet of spring-steel, by molding the spring-arm device material, by cutting the spring-arm device material, or by any other suitable method. The spring-arm clips are preferably attached to a post of the heat-sink device during step 110. The spring-arm clips are preferably located at the distal end of the spring-arm device. The shape of the spring-arm clip is preferably a u-shape. Alternatively, the spring-arm clip may be o-shaped, or may have an oblong aperture at the distal end of the spring arm.

At step 120, the spring-arm device and heat sink are coupled to the substrate. The spring arm device may be coupled to the substarte at step 120 using screws, rivets, clips, or any other suitable method.

The heat-sink device may be any type of device capable of removing heat, or energy, from the semiconductor device. Preferably, the heat-sink post has a radial arcuate groove normal to the longitudinal access of the post, and is preferably operable to receive a spring-arm clip, which may be u-shaped or comprised of an aperture within a distal end of the spring arm, such as a round or oblong aperture, and secured by a screw or other enlarged distal head inserted into the heat-sink post. At step 130, the assembly is preferably inspected to ensure that the heat sink is in contact with the package on the substrate. If, at step 130, the heat sink is not in contact with the package mounted on the substrate, the spring arms or arm may be adjusted so that the heat sink is in contact with the package. This adjustment may be performed by adjusting the heat-sink post on the heat sink, or by adjusting the angle of the spring arm to ensure that the spring-arm pressure exerted on the heat sink by the spring arm is sufficient to maintain contact of the heat sink with the package. Once the heat sink is in contact with the package and held in place by the spring arms, at step 150 the method is complete.

Figure 2:
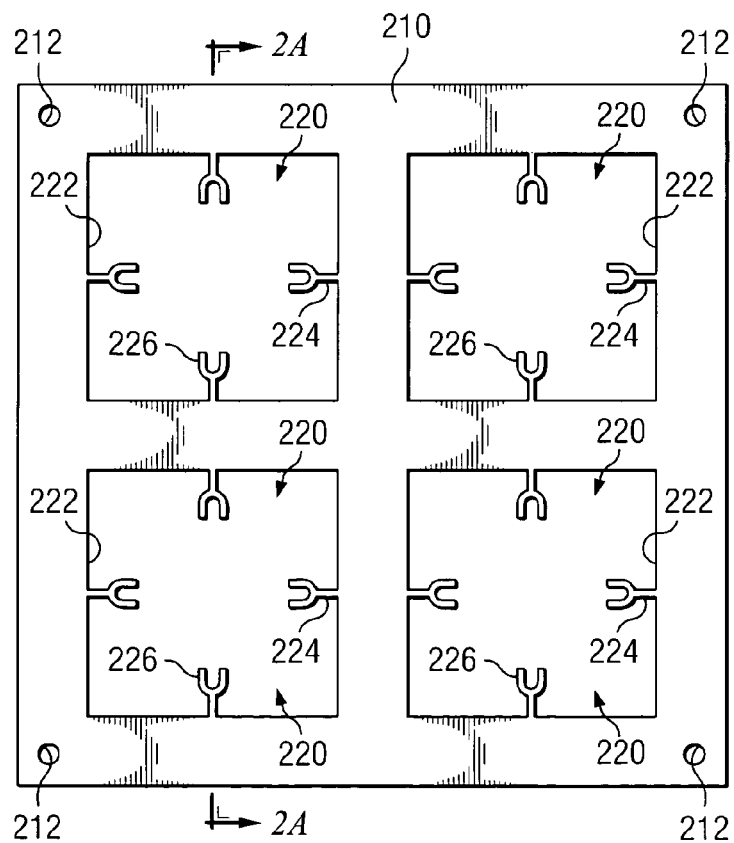
FIG. 2 is an example of a spring-arm device in accordance with an embodiment of the present invention.

FIG. 2 illustrates a spring-arm system 200 for use in a self-leveling heat sink. System 200 includes a spring-arm device 210. Spring-arm device 210 may have mounting apertures 212, device apertures 220, aperture interior surface 222, spring arms 224, and spring-arm clips 226. In a particular embodiment, mounting apertures 212 may be located at the corners of the spring-arm device, or at various locations in spring-arm device 210 to ensure that spring-arm device 210 may be securely mounted to a substrate. Although spring-arm device 210 has multiple apertures each with a plurality of spring arms 224, it should be understood that in any given spring-arm device 210, there may be one or more apertures, each aperture having one or more spring arms 224 with corresponding spring-arm clips 226. For example, a spring-arm device 210 may have a single aperture 220, that is operable to fit over a single package or multiple devices of similar dimensions in any given embodiment.

Figure 2A:
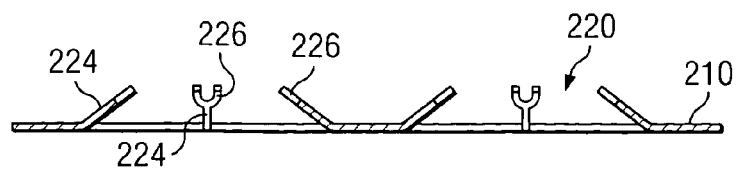
FIG. 2A is a cross-sectional view of the spring-arm device illustrated by FIG. 2.

FIG. 2A is a cross-section of spring-arm device 210 along the lines 2A as depicted in FIG. 2. In a preferred embodiment, where spring-arm device 210 is considered to exist in a plane at an angle of zero degrees, spring arms 224 having spring-arm clips 226 at the distal end are preferably configured at an angle of zero degrees. The zero degree angle in this embodiment assists in retaining the heat-sink device mounted on spring-arm clips 226 to ensure constant contact with a package mounted on a substrate through spring-pressure when a heat sink coupled to spring-arm device 210 is placed in contact with a PCB or ASIC and the spring arm device 210 is coupled to the substrate.

Figure 3:
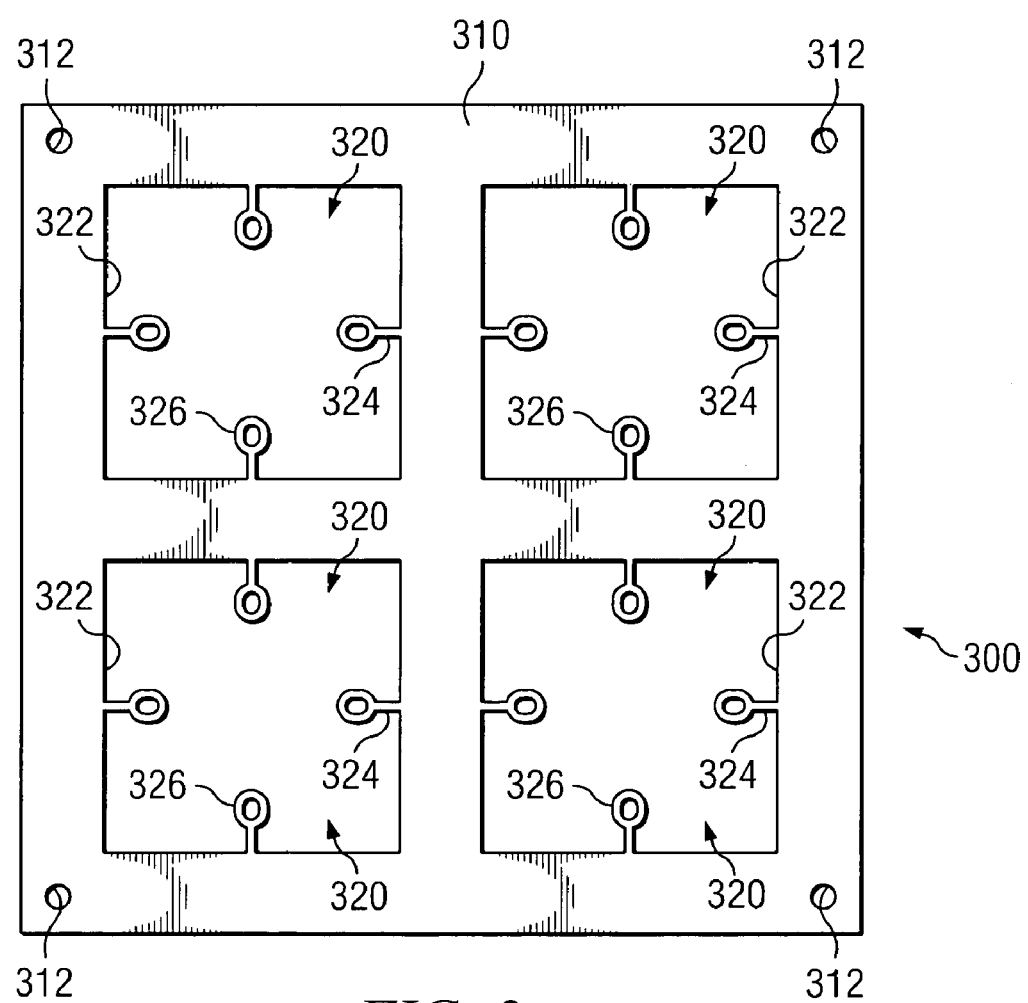
FIG. 3 is an alternate embodiment of a spring-arm device in accordance with an embodiment of the present invention.

FIG. 3 illustrates an alternative design for a spring-arm device. Spring-arm system 300 includes a spring-arm device 310 having mounting apertures 312, device apertures 320, and aperture surfaces 322 having spring arms 324 extending therefrom, having spring-arm clips 326 at the distal end of spring arms 324. The spring-arm clips 326 of spring-arm system 300 are preferably formed in a ring, are "o-shaped", or have an oblong aperture at a distal end. The aperture of spring-arm clips 326 allow for a heat-sink post to be inserted through the ring and secured by a screw, post, or other device. Additionally, spring-arm clips 326 are preferably formed with an oblong or oval aperture so that a groove in a heat sink post, such as groove 540 of heat sink post 520 of FIG. 6 may slide back and forth as pressure is loaded and unloaded from the spring-arm device and heat sink assembly. In any given embodiment, device apertures 320, spring arms 324, and spring-arm clips 326 of system 300 may be formed by cutting or punching a sheet of spring steel. Additionally, the device may be made by cutting a sheet of spring steel, or by pouring a mold using plastic, PVC, PVCA, or any other suitable metal, plastic, nylon, or vinyl compound.

Figure 4:
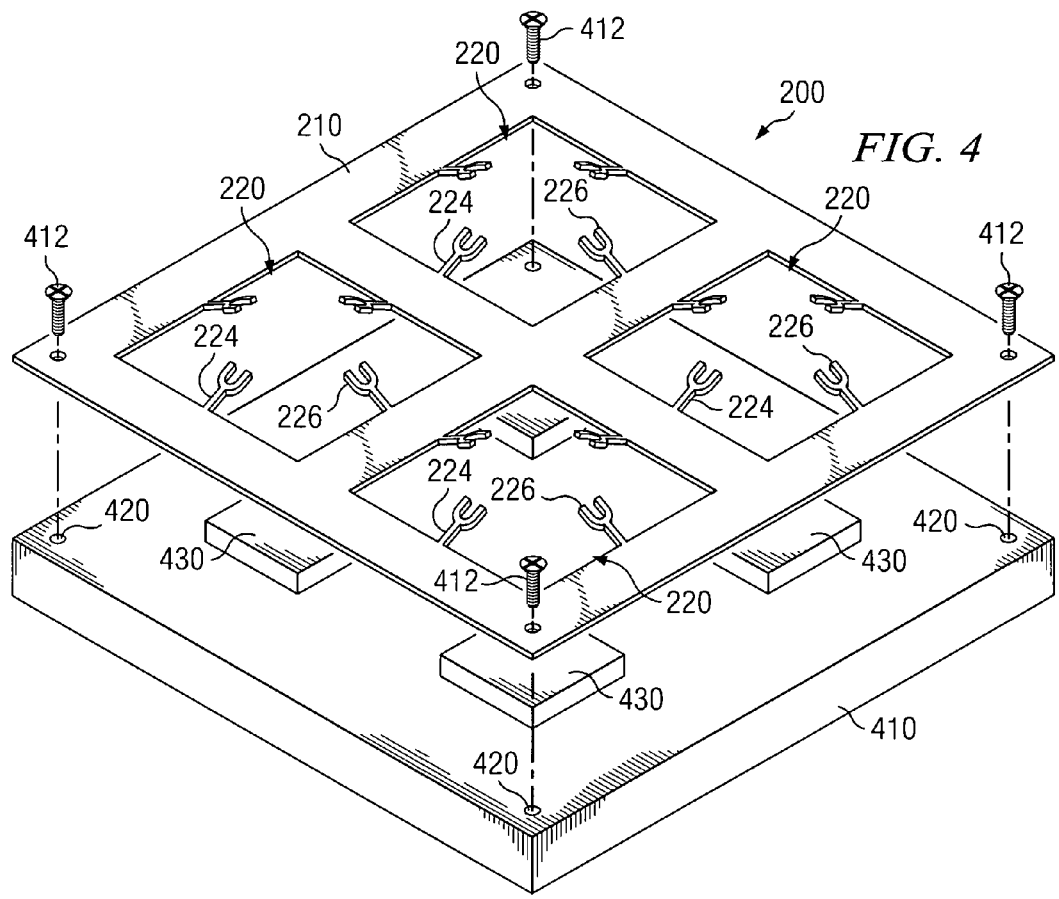
FIG. 4 is an example of a spring-arm device for mounting on a substrate in accordance with an embodiment of the present invention.
Figure 4A:
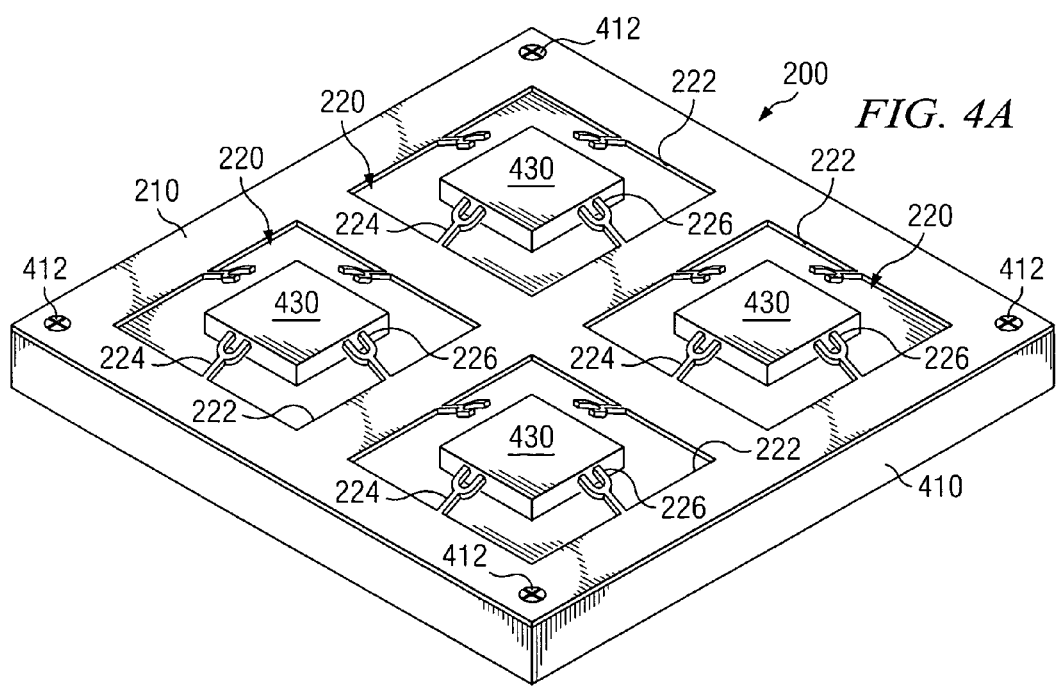
FIG. 4A is the system of FIG. 4 where the spring arm is mounted to the substrate in an embodiment of the present invention.

FIG. 4 illustrates an example of a spring-arm system 200 mounted to a substrate. It should be understood that in any given embodiment, system 200 or system 300 may be used interchangeably for mounting to the substrate as illustrated by FIG. 4. The system illustrated by FIGS. 4 and 4A is generally an illustrative system which shows the a spring-arm device mounted to a PCB. Though the embodiments shown illustrate mounting a system 200 or 300 to a substrate 410 of a PCB, other types of substrates may be used. The heat sink may be mounted to a system 200 or 300 prior to coupling the assembly to a substrate or PCB. Thus, the embodiment shown by FIGS. 4 and 4A illustrates an aspect of embodiments of the invention without a heat sink coupled to a system 200 mounted to a substrate 410. Preferably, the system shown by FIGS. 4 and 4A includes a substrate 410, mounting apertures 420, and packages 430 mounted on substrate 410. Additionally, mounting screws 412 may be used to secure spring-arm system 200 to substrate 410. Alternatively, the spring arm system 200 or 300 may be mounted to substrate 410 with an epoxy or adhesive (not explicitly shown).

In the embodiment shown, the plurality of apertures 220 of spring-arm device 210 are positioned directly over packages 430 that may pass therethrough upon mounting spring-arm device 210 to substrate 410. Preferably, apertures 220 of spring-arm device 210 are of sufficient dimensions to allow spring arms 224 having spring-arm clips 226 at a distal end thereof to be located some distance away from packages 430 when spring-arm device 210 is mounted to substrate 410.

Figure 5:
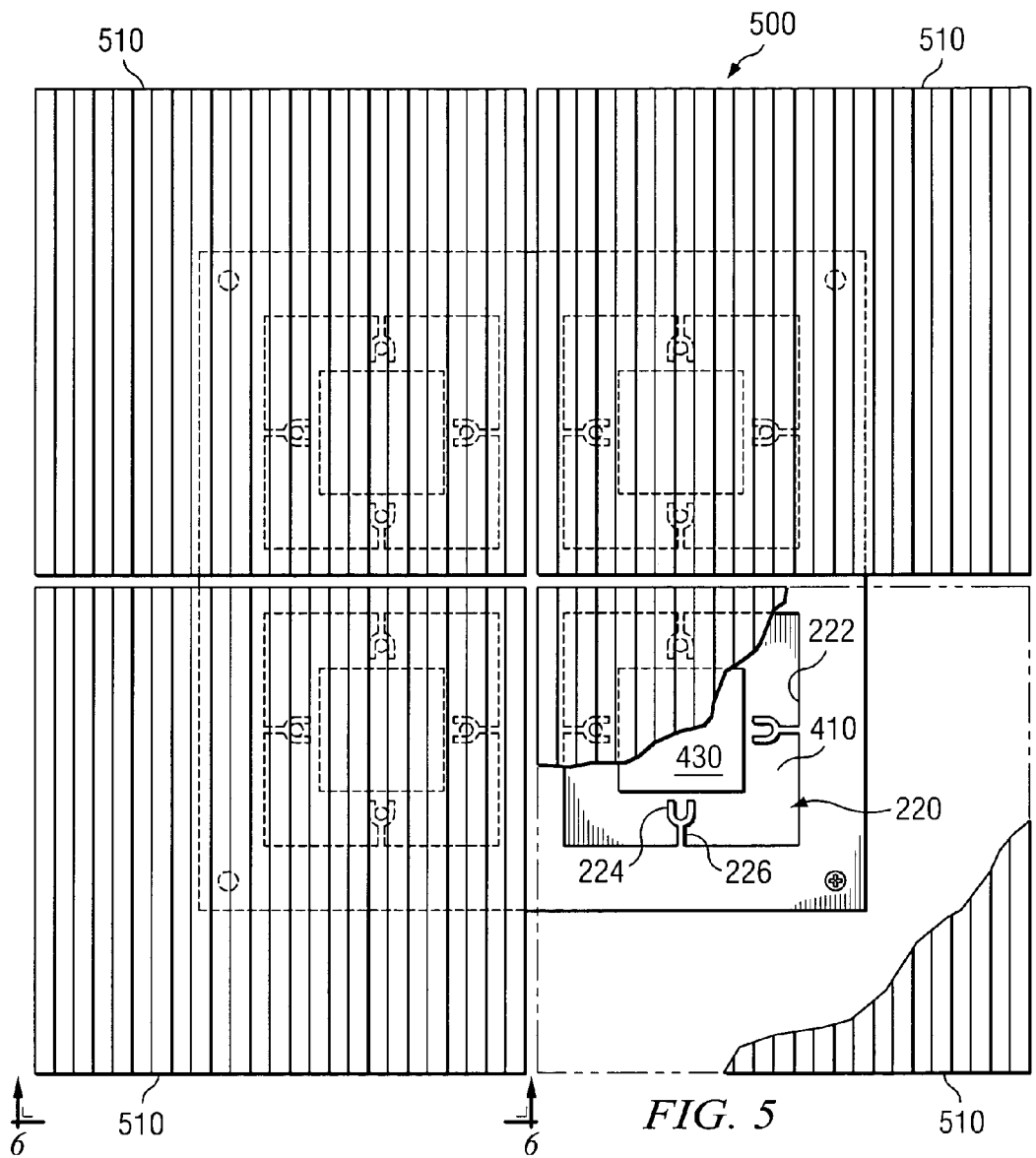
FIG. 5 is an example of heat sinks configured over individual packages in accordance with an embodiment of the present invention.

FIG. 5 illustrates a system 500 in which heat sinks 510 are placed over a semiconductor device. In the embodiment shown, four semiconductor devices each have a corresponding heat sink 510. Although each of the heat sinks 510 shown are of substantially equal dimensions, it should be understood that each heat sink may have varying dimensions. Accordingly, in any given embodiment, devices with lower energy output may be placed nearer to the center of the substrate, thus allowing larger heat sinks to cover higher-energy devices, which may be placed nearer to the edge of the device. Additionally, in a given embodiment, a PCB or ASIC may have any number of packages mounted on a substrate, with one or more packages corresponding to each aperture, and each aperture corresponding to a single heat sink.

Figure 6:
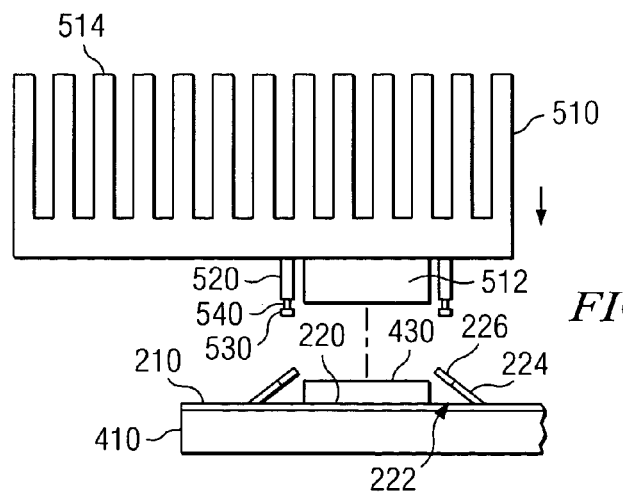
FIG. 6 is an example of a heat sink and spring-arm device in accordance with an embodiment of the present invention.

FIG. 6 illustrates an example of a heat sink 510 mounted on a semiconductor device 430 in a cross-sectional view depicted by lines 6 of FIG. 5. In the embodiment shown in FIG. 6, a heat sink 510 includes heat dissipating fins 514, contact portion 512, a heat-sink post 520, a radial arcuate groove 540 located on the longitudinal access of heat-sink post 520, and enlarged distal end 530. In one embodiment, heat-sink post 520 may be a piece of solid material having a groove cut or etched therein. In an alternative embodiment, heat-sink post 520 may be a solid post having an aperture at a distal end. In this embodiment, groove 540 may be created by inserting a screw or distal head 530 into an aperture at the distal end of heat-sink post 520 (not explicitly shown). In FIG. 6, the heat-sink 510 is positioned directly over the semiconductor device 430 mounted on substrate 410. In one embodiment, the heat sink 510 is attached to the spring-arm device 210 prior to mounting spring-arm device 210 on substrate 410.

Figure 7:
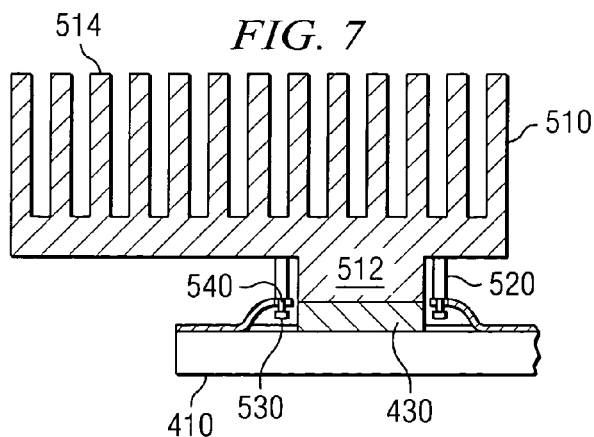
FIG. 7 is an example of a heat sink coupled to the spring-arm device in accordance with an embodiment of the present invention.
Figure 7A:
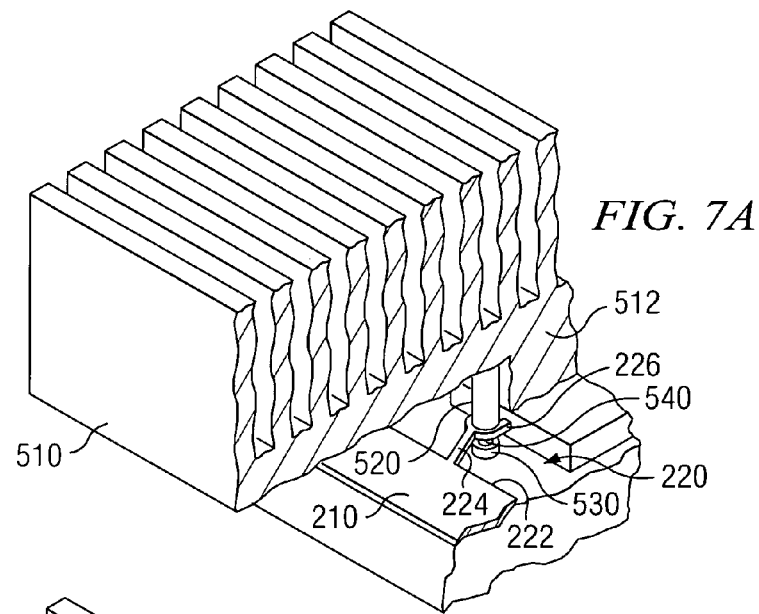
FIG. 7A is an example of a heat sink mounted with u-shaped brackets in accordance with an embodiment of the present invention.
Figure 7B:
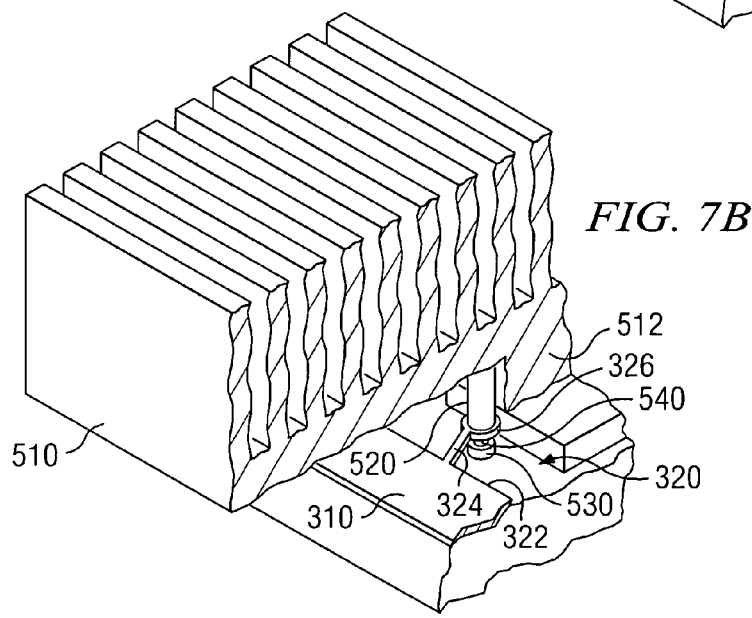
FIG. 7B is an example of a heat sink mounted to the spring-arm device with closed apertures in the spring arm in accordance with an embodiment of the present invention.

FIG. 7 illustrates a heat sink in contact with a semiconductor device in accordance with an embodiment of the invention. Accordingly, FIG. 7A illustrates an embodiment wherein spring-arm clips 226 are u-shaped so that when spring arms 224 extend to the distal end the u-shaped clip 226 inserts into the groove 540 located on heat-sink post 520. Preferably, the heat-sink clip 226 prevents significant motion toward or away from the semiconductor device 430 so that the heat sink 510 is held in contact with the semiconductor device 430 mounted on substrate 410. FIG. 7B illustrates an alternative embodiment, in which spring-arm system 300 is employed. In FIG. 7B, a spring-arm device 310 has a spring arm 324 extending from an interior surface 322 of aperture 320, such that a spring-arm clip 326 located at the distal end of spring arm 324 is in the form of an enclosed ring, or an aperture formed in spring arm 324 at the distal end. In the embodiment shown in FIG. 7B, the distal head 530 of heat-sink post 520 may be removed so that the grooved portion 540 of heat-sink post 520 may be inserted through the aperture of heat-sink clip 326 and secured by distal head 530. Upon being secured to the heat-sink post, spring arm 324 preferably provides spring-arm pressure to ensure that contact portion 512 of heat sink 510 maintains contact with a package or semiconductor device 430 mounted on substrate 410.

Although the present invention has been described in detail, it should be understood that various changes, substitutions, and alterations may be made, without departing from the spirit and scope of the present invention as defined by the claims.

What is claimed is:

1. A system for removing energy from a semiconductor, comprising:
    a spring-arm device operable to be coupled to a substrate, the spring-arm device comprising at least one aperture operable to allow at least one package mounted on a substrate to pass through when the spring-arm device is coupled to the substrate;
    a heat sink operable to remove heat from the at least one package, the heat sink comprising at least one heat sink post, the heat sink post comprising a recessed portion operable to receive a heat-sink clip; and
    at least one spring-arm extending from an inside edge of the aperture, the spring-arm comprising the at least one heat-sink clip at the distal end of the spring-arm and operable to retain a heat-sink post, the rentention of the heat sink post operable to couple the heat sink to the at least one package.

2. The system of claim 1, wherein the spring-arm device is a sheet of punched spring-steel.

3. The system of claim 1, wherein the spring-arm device is coupled to the substrate with at least one screw.

4. The system of claim 1, wherein the spring-arm device is coupled to the substrate with epoxy.

5. The system of claim 1, wherein the spring-arm device is coupled to the substrate with an adhesive.

6. The system of claim 1, wherein the heat sink clip comprises a u-shaped portion at the distal end of the spring arm.

7. The system of claim 1, wherein the at least one heat sink clip comprises an enclosed aperture at the distal end of the at least one spring arm.

8. The system of claim 1, wherein the recessed portion of the at least one heat sink post comprises an arcuate groove substantially normal to the longitudinal axis of the at least one heat sink post.

9. The system of claim 1, wherein the recessed portion of the at least one heat sink post comprises an arcuate region bounded by the distal end of the at least one heat sink post and a post inserted into the distal face of the at least one heat sink post along the longitudinal axis of the heat sink post, the post having an enlarged distal end.

10. The system of claim 9, wherein the at least one heat sink clip comprises an enclosed aperture at the distal end of the at least one spring arm, the at least one heat sink clip coupled to the at least one heat sink post by inserting the post through the aperture into the distal face of the at least one heat sink post along the longitudinal axis of the heat sink post.

11. The system of claim 1, wherein the at least one aperture comprises a plurality of apertures, each of the plurality of apertures operable to allow one of the at least one packages mounted on the substrate to pass through when the spring-arm device is coupled to the substrate.

12. The system of claim 11, wherein the at least one heat sink comprises a plurality of heat sinks, each of the plurality of heat sinks corresponding to one of the at least one packages mounted on the substrate.

13. A method for removing heat from a semiconductor device, comprising:
    coupling a spring-arm device to a substrate, the spring-arm device comprising:
        at least one aperture operable to allow at least one package mounted on the substrate to pass through; and at least one spring arm extending from an edge of each of the at least one apertures, the at least one spring arm further comprising a spring-arm clip at a distal end; and coupling at least one heat sink to the spring-arm device, the at least one heat sink comprising at least one heat sink post operable to be coupled to the at least one spring-arm clip, wherein the at least one heat sink is coupled to the spring-arm device to allow the at least one heat sink to contact the at least one package mounted on the substrate.

14. The method of claim 13, wherein the at least one heat sink comprises a plurality of heat sinks, and wherein the at least one package comprises a plurality of packages, each of the plurality of heat sinks operable to be coupled to one of the plurality of packages.

15. The method of claim 13, wherein the spring-arm clip comprises a u-shaped portion at the distal end of the at least one spring-arm, the spring-arm clip operable to be received by a radial arcuate groove about the longitudinal axis of the at least one heat sink post.

16. The method of claim 13, wherein the spring-arm clip comprises an enclosed aperture at the distal end of the at least one spring-arm, the spring-arm clip operable to be coupled to a radial arcuate groove in the at least one heat sink post.

17. The method of claim 16, further comprising securing the at least one spring-arm clip to the at least one heat sink post using an endcap, the endcap having a diameter greater than the diameter of the enclosed aperture.

18. The method of claim 13, wherein the spring-arm device further comprises a punched spring-steel plate, wherein the at least one aperture and the at least one spring arm comprise portions of the spring-steel plate.

19. The method of claim 13, wherein the at least one aperture comprises a plurality of apertures, each aperture operable to allow at least one package mounted to the substrate to pass through when the spring-arm device is coupled to the substrate.

20. The method of claim 13, wherein the at least one heat sink is coupled to the spring-arm device prior to coupling the spring-arm device to the substrate.

21. A system for removing energy from a semiconductor device, comprising:

a spring-arm plate comprising at least one spring arm having a spring-arm clip at a distal end, wherein the spring-arm plate is coupled to a substrate having at least one package mounted thereon, and wherein the spring-arm plate has at least one aperture operable to allow the at least one package to pass through; and at least one heat sink comprising at least one heat-sink post corresponding to the at least one spring arm clip, the at least one heat sink coupled to the spring-arm clip, wherein the spring-arm clip maintains contact between the at least one heat sink and the at least one package by the spring-arm pressure applied to the at least one heat sink post.

* * * * *